United States Patent
Floyd et al.

(10) Patent No.: US 8,122,312 B2
(45) Date of Patent: Feb. 21, 2012

(54) INTERNALLY CONTROLLING AND ENHANCING LOGIC BUILT-IN SELF TEST IN A MULTIPLE CORE MICROPROCESSOR

(75) Inventors: Michael S. Floyd, Austin, TX (US);
Joshua D. Friedrich, Austin, TX (US);
Robert B. Gass, Pflugerville, TX (US);
Norman K. James, Liberty Hill, TX (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 12/423,442

(22) Filed: Apr. 14, 2009

(65) Prior Publication Data
US 2010/0262879 A1 Oct. 14, 2010

(51) Int. Cl.
*G01R 31/28* (2006.01)
(52) U.S. Cl. .......................... 714/733; 714/724
(58) Field of Classification Search .............. 714/718, 714/724, 733, 745
See application file for complete search history.

(56) References Cited

U.S. PATENT DOCUMENTS

| | | | |
|---|---|---|---|
| 6,378,097 B1 | 4/2002 | Fin et al. | |
| 6,571,373 B1 | 5/2003 | Devins et al. | |
| 6,711,447 B1 | 3/2004 | Saeed | |
| 6,732,304 B1 | 5/2004 | Ong | |
| 6,978,234 B1 | 12/2005 | Battaline et al. | |
| 7,133,798 B1 | 11/2006 | Ong | |
| 7,139,945 B2 | 11/2006 | Ong | |
| 7,184,408 B2 | 2/2007 | Denton et al. | |
| 7,290,186 B1 | 10/2007 | Zorian et al. | |
| 7,313,740 B2 | 12/2007 | Ong | |
| 7,353,440 B2 * | 4/2008 | Ohwada et al. | 714/726 |
| 7,523,373 B2 * | 4/2009 | Russell et al. | 714/745 |
| 7,603,605 B2 * | 10/2009 | Mittal | 714/745 |

(Continued)

FOREIGN PATENT DOCUMENTS

JP 2005309867 11/2005

(Continued)

OTHER PUBLICATIONS

USPTO U.S. Appl. No. 12/269,490, Image File Wrapper printed Dec. 28, 2010, 1 page.

(Continued)

*Primary Examiner* — James C Kerveros
(74) *Attorney, Agent, or Firm* — Stephen R. Tkacs; Stephen J. Walder, Jr.; Diana R. Gerhardt

(57) ABSTRACT

A mechanism is provided for internally controlling and enhancing logic built-in self test in a multiple core microprocessor. The control core may use architectural support for scan and external scan communication (XSCOM) to independently test the other cores while adjusting their frequency and/or voltage. A program loaded onto the control core may adjust the frequency and configure the LBIST to run on each of the cores under test. Once LBIST has completed on a core under test, the control core's program may evaluate the results and decide a next test to run for that core. For isolating failing latch positions, the control core may iteratively configure the LBIST mask and sequence registers on the core under test to determine the location of the failing latch. The control core may control the LBIST stump masks to isolate the failure to a particular latch scan ring and then position within that ring.

20 Claims, 11 Drawing Sheets

U.S. PATENT DOCUMENTS

| | | | |
|---|---|---|---|
| 7,665,000 B2 * | 2/2010 | Gonzalez et al. | 714/724 |
| 7,665,005 B2 * | 2/2010 | Szydlowski | 714/745 |
| 7,734,967 B2 * | 6/2010 | Chung et al. | 714/719 |
| 7,774,671 B2 * | 8/2010 | Dempsey | 714/745 |
| 7,797,596 B2 * | 9/2010 | Dixit et al. | 714/721 |
| 8,001,405 B2 | 8/2011 | Dittmann et al. | |
| 2003/0005380 A1 | 1/2003 | Nguyen et al. | |
| 2004/0006729 A1 * | 1/2004 | Pendurkar | 714/733 |
| 2004/0153793 A1 | 8/2004 | Jarboe et al. | |
| 2005/0100102 A1 | 5/2005 | Gazdzinski et al. | |
| 2005/0102565 A1 | 5/2005 | Barr et al. | |
| 2005/0162182 A1 | 7/2005 | Ong | |
| 2005/0235263 A1 | 10/2005 | Bundy et al. | |
| 2005/0240850 A1 | 10/2005 | Ohwada et al. | |
| 2005/0289286 A1 | 12/2005 | Ohwada | |
| 2005/0289428 A1 | 12/2005 | Ong | |
| 2006/0248394 A1 | 11/2006 | McGowan | |
| 2006/0248395 A1 | 11/2006 | McGowan | |
| 2006/0277436 A1 | 12/2006 | McGowan | |
| 2007/0022342 A1 | 1/2007 | Picano et al. | |
| 2007/0130489 A1 | 6/2007 | Kiryu et al. | |
| 2007/0168808 A1 | 7/2007 | Ong | |
| 2007/0168809 A1 | 7/2007 | Kiryu et al. | |
| 2007/0260823 A1 | 11/2007 | Dickinson et al. | |
| 2008/0016404 A1 | 1/2008 | Ishikawa et al. | |
| 2008/0082881 A1 | 4/2008 | Szydlowski | |
| 2008/0168318 A1 * | 7/2008 | DeMent et al. | 714/745 |
| 2009/0138737 A1 | 5/2009 | Kim et al. | |
| 2010/0023807 A1 | 1/2010 | Wu et al. | |
| 2010/0122116 A1 | 5/2010 | Floyd et al. | |

FOREIGN PATENT DOCUMENTS

| | | | |
|---|---|---|---|
| WO | WO 01/29666 A1 | 4/2001 | |

OTHER PUBLICATIONS

U.S. Appl. No. 12/269,490, filed Nov. 12, 2008, Floyd, Michael S. et al.

Final Office Action mailed Feb. 25, 2011 for U.S. Appl. No. 12/269,490; 13 pages.

Interview Summary dated Apr. 12, 2011 for U.S. Appl. No. 12/269,490; 3 pages.

Appeal Brief filed Jul. 21, 2011, U.S. Appl. No. 12/269,490, 27 pages.

Notice of Allowance mailed Nov. 23, 2011 for U.S. Appl. No. 12/269,490, 12 pages.

* cited by examiner

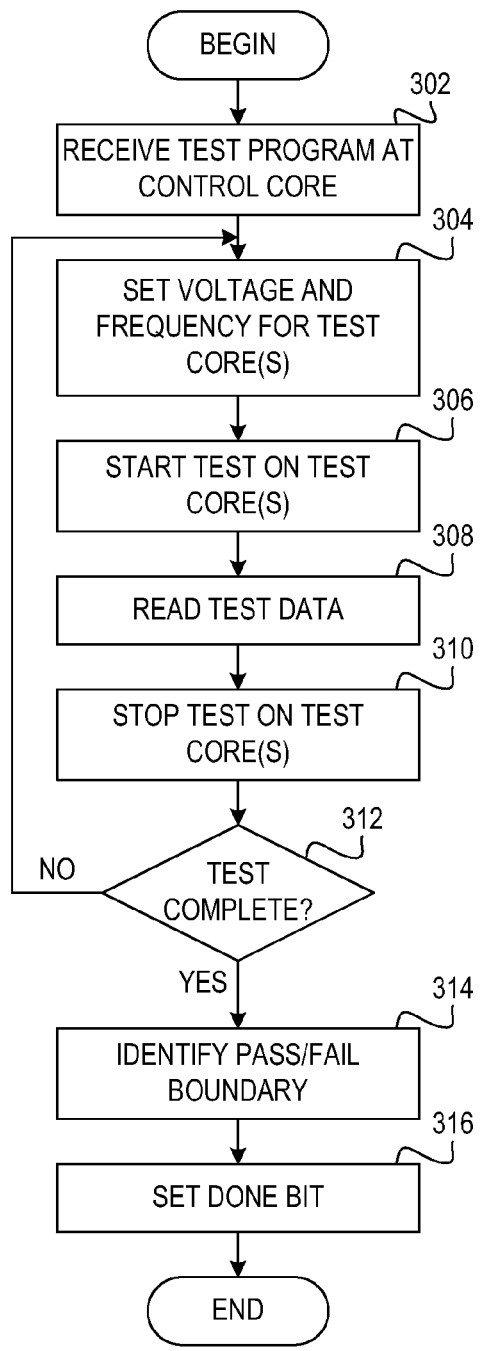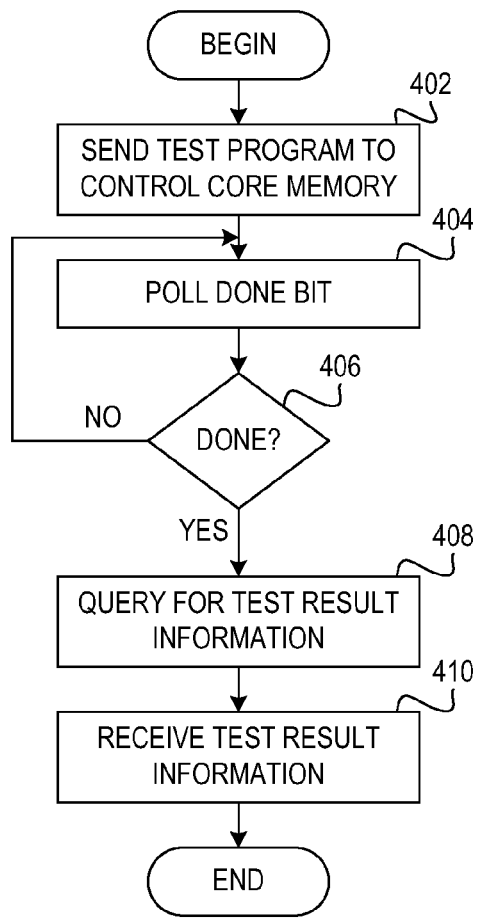

LOOP A

LOOP B

INTERNALLY CONTROLLING AND ENHANCING LOGIC BUILT-IN SELF TEST IN A MULTIPLE CORE MICROPROCESSOR

BACKGROUND

The present application relates generally to an improved data processing apparatus and method and more specifically to an apparatus and method for internally controlling and enhancing logic built-in self test in a multiple core microprocessor.

A multiple core processor combines two or more independent cores into a single package composed of a single integrated circuit (IC), called a die, or more dies packaged together. For example, a dual-core processor contains two cores, and a quad-core processor contains four cores. A multiple core microprocessor implements multiprocessing in a single physical package. The processors also share the same interconnect to the rest of the system. A system with n cores is effective when it is presented with n or more threads concurrently. Multiple core technology is widely used in many technology areas, especially those of embedded processors, such as network processors and digital signal processors, and in graphical processing units.

With the advent of multiple core processors and on-chip frequency and/or voltage control, new problems and opportunities present themselves. In order to optimize power and performance tradeoffs on multiple core chips during normal operation or runtime, one may wish to adjust on-chip frequency and voltage for each core. Furthermore, to mitigate process yield issues, manufacturers may configure chips with bad cores to operate without the failing core. This means that one must test the functionality and electrical properties of each core independently, which increases the test and characterization time for each chip by a factor of the number of cores on the chip and complicates the manufacturing test procedures.

Logic built-in self test (LBIST) is an important tool in today's microprocessors for isolating critical paths, sorting of frequency, and at AC (at-speed) and DC (stuck-at-fault) logic test coverage. Because LBIST compresses the latches into a multiple input shift register (MISR), it is difficult to determine which latch failed. Typically, software is written for the external testing device to isolate the failing latch using binary searches and the results from a known good device under test from the same device under test at a lower frequency if the fail is a critical path type fail. This latch isolation is extremely time-consuming. An increasing number of processor cores being designed onto a single chip drastically increases this already lengthy test time.

SUMMARY

In one illustrative embodiment, a method, in a data processing system, is provided for internally controlling advanced test and characterization in a multiple core microprocessor. The method comprises receiving a test program at a control core within the multiple core microprocessor. The multiple core microprocessor comprises a plurality of processing cores including the control core. The method further comprises setting, by the control core, voltage and frequency for a test core within the plurality of processing cores and performing a test, under control of the control core, on the test core. The method further comprises reading, by the control core, test data from the test core and identifying, by the control core, operational parameters for the test core.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a multiple core microprocessor is provided. The multiple core microprocessor may comprise a plurality of processing cores, including a control core, and a memory coupled to the one or more processors. The memory may comprise instructions which, when executed by the one or more processors, cause the one or more processors to perform various ones, and combinations of, the operations outlined above with regard to the method illustrative embodiment.

These and other features of the illustrative embodiments will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 3 is a flowchart outlining example operations of a control core for internally controlling and enhancing advanced test and characterization in a multiple core microprocessor in accordance with an illustrative embodiment;

FIG. 4 is a flowchart outlining example operations of an external test device for advanced test and characterization in a multiple core microprocessor in accordance with an illustrative embodiment;

DETAILED DESCRIPTION

Figure 1:
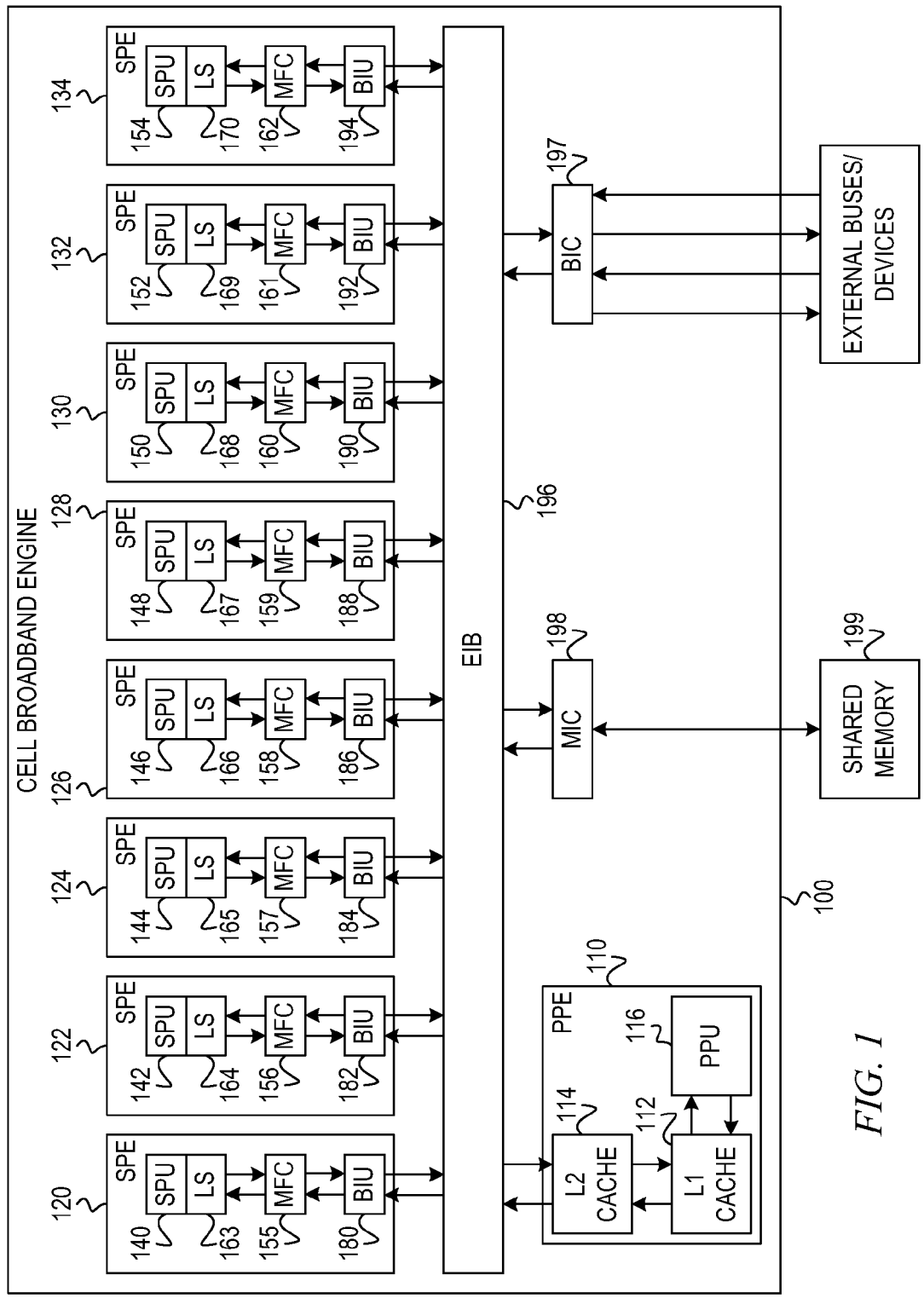
FIG. 1 is an exemplary block diagram of a data processing system in which aspects of the present invention may be implemented.

The illustrative embodiments provide a mechanism for internally controlling and enhancing logic built-in self test in a multiple core microprocessor. To decrease the time needed to test a multiple core chip, the mechanism uses micro-architectural support that allows one core, a control core, to run a functional program to test the other cores. Test time is reduced by eliminating the need to communicate with an external testing device during the test sequence, which is relatively inefficient compared to internal chip communications. Because the speed at which the program runs at-speed on one of the processor cores, many new test opportunities exist that in the past have been prohibitive due to test time and tester memory limitations.

Any core on the chip can be designated to be the control core as long as it has already been tested for functionality at one safe frequency and voltage operating point. An external testing device loads a small program into the control core's dedicated memory, such as the level two (L2) cache. The program functionally running on the control core uses micro-architectural support for functional scan and external scan communication to independently test the other cores while adjusting the frequencies and/or voltages of the other cores until failure. The control core may independently test the other cores by starting, stopping, and determining pass/fail results.

In one embodiment, the control core may perform multiple runs to determine a "solid" pass/fail boundary, such as four passes in a row with no fail, for instance. In another embodiment, the control core may sample built-in sensors, such as temperature, amperage, voltage, critical path monitors, etc. For example, the control core may determine the amount of power being consumed by a given core during the test and look for maximum frequency at a prescribed power and/or voltage limit to allow the parts to be sorted into bins or buckets in the process of determining yield.

In one illustrative embodiment, the control core may use architectural support for scan and external scan communication (XSCOM) to independently test the other cores while adjusting their frequency and/or voltage. Each core has a dedicated logic built-in self test (LBIST) engine. A program loaded onto the control core may adjust the frequency and configure the LBIST to run on each of the cores under test. Once LBIST has completed on a core under test, the control core's program may evaluate the results and decide a next test to run for that core.

For isolating failing latch positions, the control core may iteratively configure the LBIST mask and sequence registers on the core under test to determine the location of the failing latch. For at-speed (AC) type defects, a lower frequency and higher voltage run may be used as a "golden" signature against which each test scan may be compared. For DC type defects, a run on another known good core or from a simulation environment (e.g., hardware accelerators) may be used as a signature against which each test scan may be compared.

The control core may control the LBIST stump masks to isolate the failure to a particular latch scan ring and then position within that ring. By masking known bad stumps/locations, the control core may use sophisticated software written to "peel the onion" and find several "top" failing paths for future root cause and characterization analysis. For a multiple core processor, this sophistication is too much to include on an external tester.

Thus, the illustrative embodiments may be utilized in many different types of multiple core data processing environments including system-on-a-chip environments, heterogeneous multiple processor environments, or the like. In order to provide a context for the description of the specific elements and functionality of the illustrative embodiments, FIG. 1 is provided hereafter as an example environment in which aspects of the illustrative embodiments may be implemented. While the description following FIG. 1 will focus primarily on a single data processing device implementation, this is only an example and is not intended to state or imply any limitation with regard to the features of the present invention.

With reference now to the figures and in particular with reference to FIG. 1, an example diagram of a data processing environment is provided in which illustrative embodiments of the present invention may be implemented. It should be appreciated that FIG. 1 is only an example and is not intended to assert or imply any limitation with regard to the environments in which aspects or embodiments of the present invention may be implemented. Many modifications to the depicted environment may be made without departing from the spirit and scope of the present invention.

FIG. 1 is an exemplary block diagram of a data processing system in which aspects of the present invention may be implemented. The exemplary data processing system shown in FIG. 1 is an example of the Cell Broadband Engine™ (Cell/B.E.™) data processing system. While the Cell/B.E.™ data processing system will be used in the description of the preferred embodiments of the present invention, the present invention is not limited to such, as will be readily apparent to those of ordinary skill in the art upon reading the following description. CELL BROADBAND ENGINE and CELL/B.E. are trademarks of Sony Computer Entertainment, Inc., in the United States, other countries, or both.

As shown in FIG. 1, the Cell/B.E.™ data processing system 100 includes a power processor element (PPE) 110 having a processor (PPU) 116 and its L1 and L2 caches 112 and 114, and multiple synergistic processor elements (SPEs) 120-134 that each has its own synergistic processor unit (SPU) 140-154, memory flow control 155-162, local memory or store (LS) 163-170, and bus interface unit (BIU unit) 180-194 which may be, for example, a combination direct memory access (DMA), memory management unit (MMU), and bus interface unit. A high bandwidth internal element interconnect bus (EIB) 196, a bus interface controller (BIC) 197, and a memory interface controller (MIC) 198 are also provided.

The local memory or local store (LS) 163-170 is a non-coherent addressable portion of a large memory map which, physically, may be provided as small memories coupled to the SPUs 140-154. The local stores 163-170 may be mapped to different address spaces. These address regions are continuous in a non-aliased configuration. A local store 163-170 is associated with its corresponding SPU 140-154 and SPE 120-134 by its address location, such as via the SPU Identification Register, described in greater detail hereafter. Any resource in the system has the ability to read/write from/to the local store 163-170 as long as the local store is not placed in a secure mode of operation, in which case only its associated SPU may access the local store 163-170 or a designated secured portion of the local store 163-170.

The Cell/B.E.™ data processing system 100 may be a system-on-a-chip such that each of the elements depicted in FIG. 1 may be provided on a single microprocessor chip. Moreover, the Cell/B.E.™ data processing system 100 is a heterogeneous processing environment in which each of the SPUs may receive different instructions from each of the other SPUs in the system. Moreover, the instruction set for the SPUs is different from that of the PPU, e.g., the PPU may execute Reduced Instruction Set Computer (RISC) based instructions while the SPU execute vectorized instructions.

The SPEs 120-134 are coupled to each other and to the L2 cache 114 via the EIB 196. In addition, the SPEs 120-134 are coupled to MIC 198 and BIC 197 via the EIB 196. The MIC 198 provides a communication interface to shared memory 199. The BIC 197 provides a communication interface between the Cell/B.E.™ data processing system 100 and other external buses and devices.

The PPE 110 is a dual threaded PPE 110. The combination of this dual threaded PPE 110 and the eight SPEs 120-134 makes the Cell/B.E.™ data processing system 100 capable of handling 10 simultaneous threads and over 128 outstanding memory requests. The PPE 110 acts as a controller for the other eight SPEs 120-134 which handle most of the computational workload. The PPE 110 may be used to run conventional operating systems while the SPEs 120-134 perform vectorized floating point code execution, for example.

The SPEs 120-134 comprise a synergistic processing unit (SPU) 140-154, memory flow control units 155-162, local memory or store 163-170, and an interface unit 180-194. The local memory or store 163-170, in one exemplary embodiment, comprises a 256 KB instruction and data memory which is visible to the PPE 110 and can be addressed directly by software.

The PPE 110 may load the SPEs 120-134 with small programs or threads, chaining the SPEs together to handle each step in a complex operation. For example, a set-top box incorporating the Cell/B.E.™ data processing system 100 may load programs for reading a DVD, video and audio decoding, and display, and the data would be passed off from SPE to SPE until it finally ended up on the output display. At 4 GHz, each SPE 120-134 gives a theoretical 32 GFLOPS of performance with the PPE 110 having a similar level of performance.

The memory flow control units (MFCs) 155-162 serve as an interface for an SPU to the rest of the system and other elements. The MFCs 155-162 provide the primary mechanism for data transfer, protection, and synchronization between main storage and the local storages 163-170. There is logically an MFC for each SPU in a processor. Some implementations can share resources of a single MFC between multiple SPUs. In such a case, all the facilities and commands defined for the MFC must appear independent to software for each SPU. The effects of sharing an MFC are limited to implementation-dependent facilities and commands.

Figure 2A:
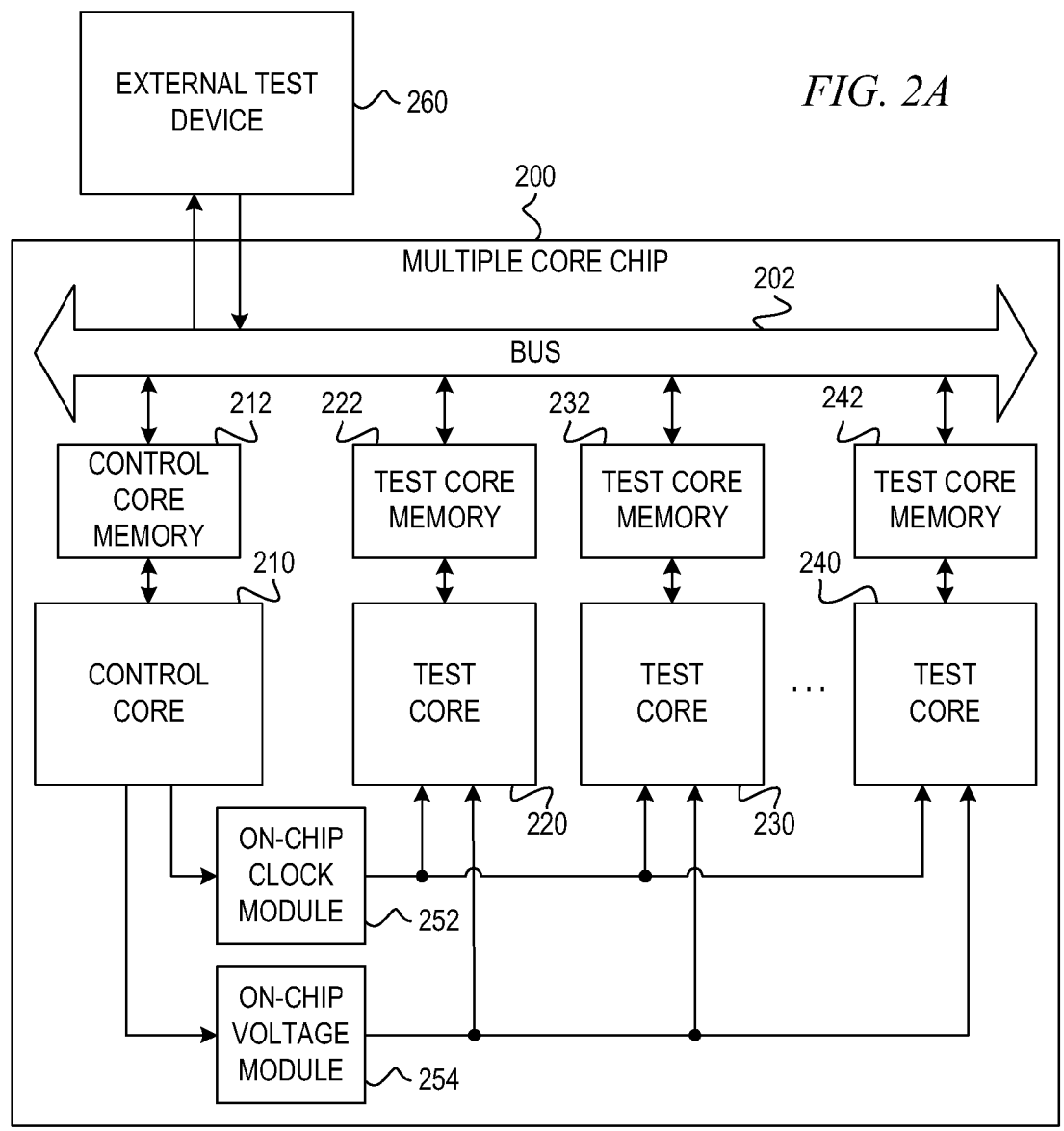
FIG. 2A is a block diagram illustrating a mechanism for internally controlling and enhancing advanced test and characterization in a multiple core microprocessor in accordance with an illustrative embodiment.

FIG. 2A is a block diagram illustrating a mechanism for internally controlling and enhancing advanced test and characterization in a multiple core microprocessor in accordance with an illustrative embodiment. With reference to FIG. 2A, multiple core chip 200 may comprise a control core 210 and a plurality of test cores 220, 230, 240. Multiple core chip 200 may be the Cell Broadband Engine™ data processing system 100 in FIG. 1, for example. Control core 210 may be power processing element (PPE) 110, for example; however, control core 210 may be any core on a multiple core chip as long as it has already been tested for functionality at a safe frequency and voltage operating point. Test cores 220, 230, 240 may be synergistic processing elements 120-134 in FIG. 1, for example. While the example shown in FIG. 2A shows at least three test cores 220, 230, 240, the multiple core chip may include more or fewer test cores without departing from the spirit and scope of the illustrative embodiment. In fact, in an alternative embodiment, multiple core chip 200 may include a plurality of control cores.

External test device 260 loads a small program into control core memory 212 via bus 202. Control core 210 may load test programs into test core memories 222, 232, 242 to be run on test cores 220, 230, 240. The program functionality running on control core 210 may use micro-architectural support for functional scan and external scan communication to independently test the other cores. That is, control core 210 may send instructions to start, stop, and determine pass/fail results using micro-architectural support. Test cores 220, 230, 240 may store results in test core memories 222, 232, 242.

Control core memory 212 may be, for example, L2 cache 114 in FIG. 1. Test core memories 222, 232, 242 may be, for example, local stores, such as local stores 163-170, for example. Alternatively, test core memories 222, 232, 242 may comprise registers or trace arrays associated with test cores 220, 230, 240. Test core 210 may communicate with test cores 220, 230, 240 by setting and reading registers within test core memories 222, 232, 242. Alternatively, control core 210 may communicate with test cores 220, 230, 240 by setting registers in control core memory 212, where test cores 220, 230, 240 may be configured to poll the registers in control core memory 212.

More particularly, control core 210 may communicate with on-chip clock module 252 and on-chip voltage module 254 to adjust the frequency and/or voltage of the test cores 220, 230, 240. For example, control core 210 may communicate with on-chip clock module 252 to increase the frequency of test core 220 until failure. As another example, control core 210 may communicate with on-chip voltage module 254 to decrease the voltage to core 230 until failure.

On-chip clock module 252 may comprise digital phase lock loop (PLL) circuits or similar digitally controlled on-chip clock generation circuits. A phase lock loop (PLL) is a control system that generates a signal that has a fixed relation to the phase of a reference signal. A PLL circuit responds to both the frequency and the phase of the input signal, automatically raising or lowering the frequency of a controlled oscillator until it is matched to the reference in both frequency and phase. PLL circuits are widely used in radio, telecommunications, computers and other electronic applications. They may generate stable frequencies, recover a signal from a noisy communication channel, or distribute clock timing pulses in digital logic designs such as microprocessors. Since a single integrated circuit can provide a complete PLL building block, the technique is widely used in modern electronic devices with output frequencies from a fraction of a cycle per second up to many GHz.

On-chip voltage module 254 may alter the voltage to test cores 220, 230, 240 under control of control core 210. On-chip voltage module 254 may include, for example, voltage divider networks or other circuitry to individually modify the voltage to test cores 220, 230, 240.

Figure 2B:
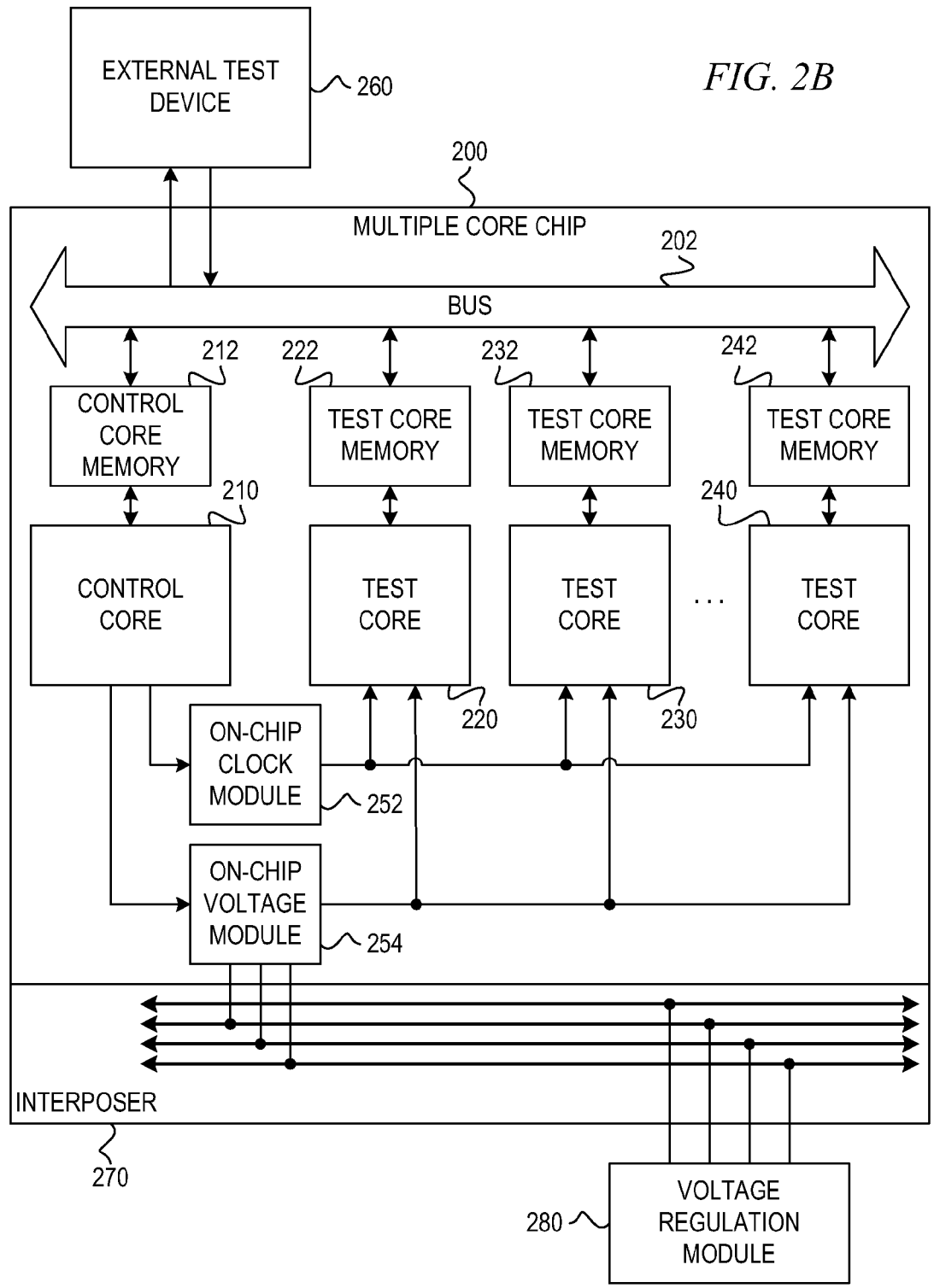
FIG. 2B is a block diagram illustrating a mechanism for internally controlling and enhancing advanced test and characterization in a multiple core microprocessor, controlling on-chip voltage via an interposer, in accordance with an illustrative embodiment.

FIG. 2B is a block diagram illustrating a mechanism for internally controlling and enhancing advanced test and characterization in a multiple core microprocessor, controlling on-chip voltage via an interposer, in accordance with an illustrative embodiment. As shown in FIG. 2B, on-chip voltage module 254 modifies voltage identifiers (VIDs) of test cores 220, 230, 240 through interposer 270. An interposer is an electrical interface routing between one socket or connection to another. The purpose of interposer 270 is to reroute a connection to a different connection. Thus, voltage regulator module 280 may read a VID from on-chip voltage module 254, through interposer 270, instead of test core 220. This allows control core 210 to modify VIDs for test cores 220, 230, 240 independently to control the voltage being provided to the test cores.

In one embodiment, control core 210 performs a simple linear or binary search to find a maximum working frequency at selected voltage levels. Multiple runs may be performed for each test core 220, 230, 240 to determine a solid pass/fail boundary, such as, for example, four passes in a row with no fail. Furthermore, control core 210 may read built-in sensors to sample temperature, amperage, voltage, critical path monitors, etc. For example, if current sensors are present, control core 210 may determine an amount of power being consumed by a test core during the test and look for a maximum frequency at a prescribed power and/or voltage limit to allow chips to be sorted into bins/buckets in the process of determining yield.

Control core 210 may store results in control core memory 212. Furthermore, control core 210 may set a "done" bit in a register in control core memory 212, and external test device 260 may poll the done bit to determine whether the test is completed. When the external test device 260 determines that the done bit is set in control core memory 212, external test device may query control core memory 212, or an on-chip trace array (not shown), for result information.

Thus, in accordance with the illustrative embodiments, external test device 260 may load a small program into control core memory 212, wait for the test to complete, and retrieve result data from control core memory 212. As such, external test device 260 may quickly and efficiently determine the operational parameters for multiple core microprocessor chip 200 including multiple permutations of the plurality of cores 210, 220, 230, 240. Micro-architectural support, on-chip frequency control, and on-chip voltage control allow multiple core microprocessor chip 200 to control its own frequency and voltage in a test environment, thus eliminating the need to communicate with external test device 260 during the test sequence. Off-chip communication is relatively inefficient compared to internal chip communications. Because of the speed at which the program runs on one of the cores, many new test opportunities exist that in the past would have been prohibitive, or at least extremely inefficient, due to test time and tester memory limitations.

Figure 2C:
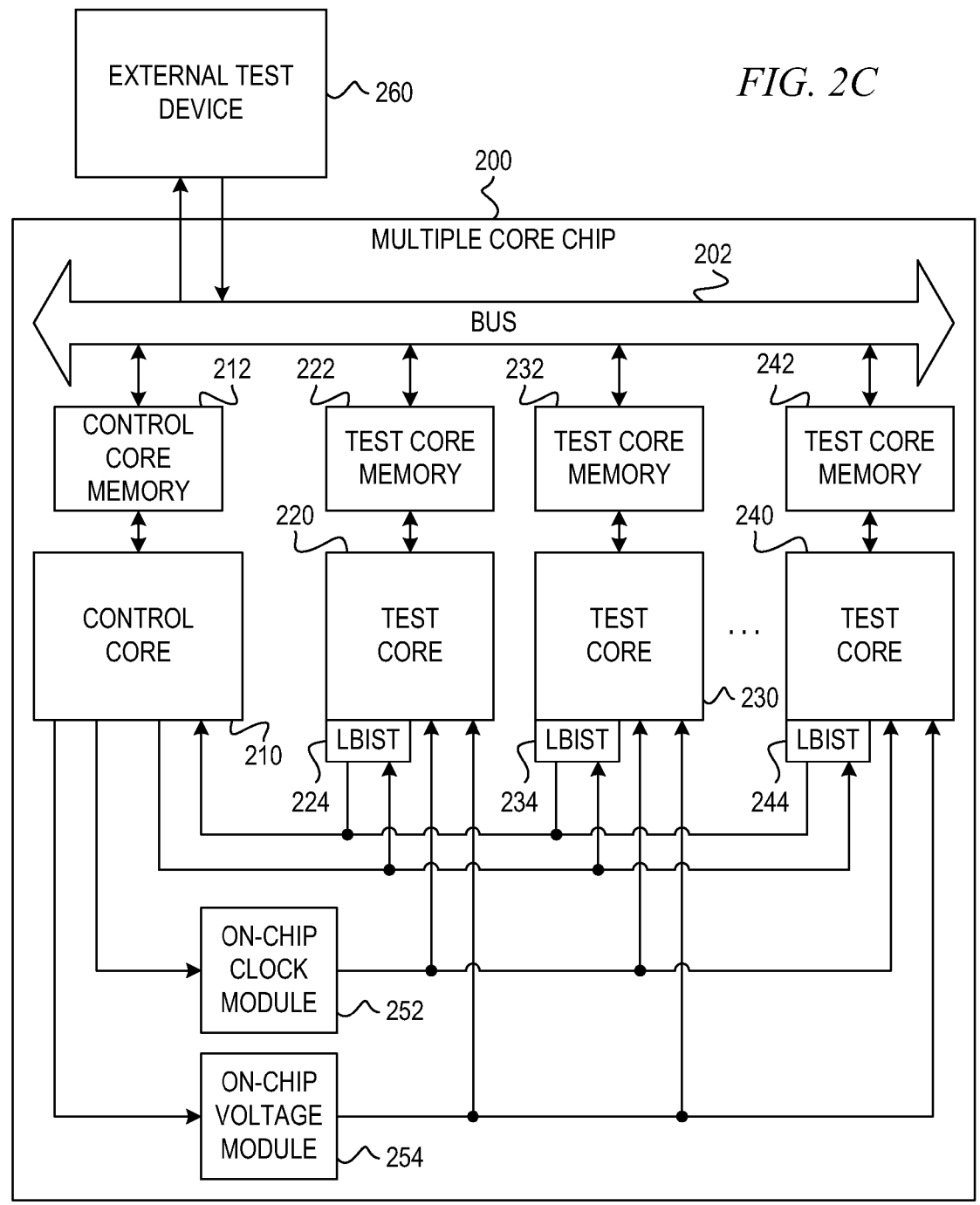
FIG. 2C is a block diagram illustrating a mechanism for internally controlling and enhancing logic built-in self test in a multiple core microprocessor in accordance with an illustrative embodiment.

FIG. 2C is a block diagram illustrating a mechanism for internally controlling and enhancing logic built-in self test in a multiple core microprocessor in accordance with an illustrative embodiment. As shown in FIG. 2C, test cores 220, 230, 240 has a dedicated logic built-in self test (LBIST) engine 224, 234, 244, respectively. External test device 260 loads a scan and test program into control core memory 212 via bus 202. The scan and test program causes control core 210 to adjust the frequency, via on-chip clock module 252, and the voltage, via on-chip voltage module 254, of test cores 220, 230, 240. Control core 210 also configures LBIST engines 224, 234, 244 to run on each test core 220, 230, 240. Once LIBST has completed on a given core, such as test core 220 for example, the scan and test program may determine a next test to run for the given core.

Control core 210 may iteratively configure LBIST mask and sequence registers on each core under test to determine the location of a failing latch. Each LBIST engine 224, 234, 244 may be used for DC and/or AC fault detection and isolation. DC fault detection entails determining whether the circuit being tested has at least a DC stack-at or "broken" chain while AC fault detection includes determining whether the circuit has an AC defect. For at-speed (AC) type defects, a lower frequency/higher voltage scan may be used as a "golden" signature against which to compare. For DC type defects, a run on a known good core or from a simulation environment (e.g., hardware accelerators) may be used as a signature against which to compare.

Control core 210 may control LBIST stump masks to isolate a failure to a particular latch scan ring and then to a position within that scan ring. By masking known bad scan rings and locations within scan rings, control core 210 can have sophisticated software written to "peel the onion" and find the several "top" failing paths for future root cause and characterization analysis. After all testing is complete, control core 210 may store results in control core memory 212 or test core memory 222, 232, 242, or may scan the results into the scan rings of test cores 220, 230, 240 where they may be retrieved later for evaluation.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 3 is a flowchart outlining example operations of a control core for internally controlling and enhancing advanced test and characterization in a multiple core microprocessor in accordance with an illustrative embodiment. Operation begins, and the control core receives a test program within its dedicated memory (block 302). The control core then sets voltage and frequency on-chip for one or more test cores within the multiple core microprocessor (block 304). In one embodiment, the control core tests only a single test core at a time to determine individual operational parameters for each core. In an alternative embodiment, the control core may test a plurality of cores in parallel to determine combinations of cores and operational parameters for each combination. For example, if the multiple core microprocessor has eight cores, the control core may identify a combination of four cores with the best operational parameters for a particular purpose. Then, all but those four cores may be disabled to yield a high-performance quad-core microprocessor chip.

Next, the control core starts the test on the test core(s) (block 306). The control core may use micro-architectural support to communicate test start and stop events. The control core reads test data by reading registers, sensors, or trace array data (block 308). Thereafter, the control core stops the test on the test core(s) (block 310) and determines whether the test process is complete (block 312). In block 312, the test may be complete, for example, when the control core has run through all frequencies for all selected voltage values for all cores or combinations of cores.

If the test is not complete, operation returns to block 304 to set voltage and frequency on-chip for one or more cores. This process may repeat multiple times for each core to identify frequency, voltage, and power limits for each core or for combinations of cores and pass/fail boundaries. The control core may store intermediate results to be queried by the external test device.

If the test is complete in block 312, the control core may identify pass/fail boundaries for the test cores (block 314). For example, the control core may perform a linear or binary search to identify a maximum frequency at selected voltage levels. Because the control core may perform multiple runs for each frequency and voltage and core, the control core may identify a "solid" pass/fail boundary, such as four passes in a row without a fail. The control core may also sample built-in sensors to provide more detailed operational parameters. The built-in sensors may include, for example, temperature, amperage, voltage, critical path monitors, etc. For instance, if current sensors are present, the control core may determine the amount of power being consumed by a test core during the test and look for a maximum frequency at a prescribed power and/or voltage limit to allow parts to be sorted into bins/buckets in the process of determining yield. When the control core has completed the test and identified and stored all the pass/fail boundary information, the control core sets a done bit (block 316), and operation ends.

FIG. 4 is a flowchart outlining example operations of an external test device for advanced test and characterization in a multiple core microprocessor in accordance with an illustrative embodiment. Operation begins and the external test device sends a test program to a dedicated memory of an identified control core (block 402). Then, the external test device polls a done bit that is set by the control core when the internally controlled test is completed (block 404). The external test device determines whether the done bit is set (block 406). If the done bit is not set, operation returns to block 404 to poll the done bit. The external test device polls the done bit until the control core on the multiple core microprocessor completes the test.

If the done bit is set in block 406, the external test device queries for test result information (block 408). The control core may store the test result information in the dedicated memory of the control core. The test result information may include the pass/fail boundary information, operational parameter information for individual cores and combinations of cores, intermediate results, etc. The external device then receives the test result information (block 410). Thereafter, operation ends.

Figure 5:
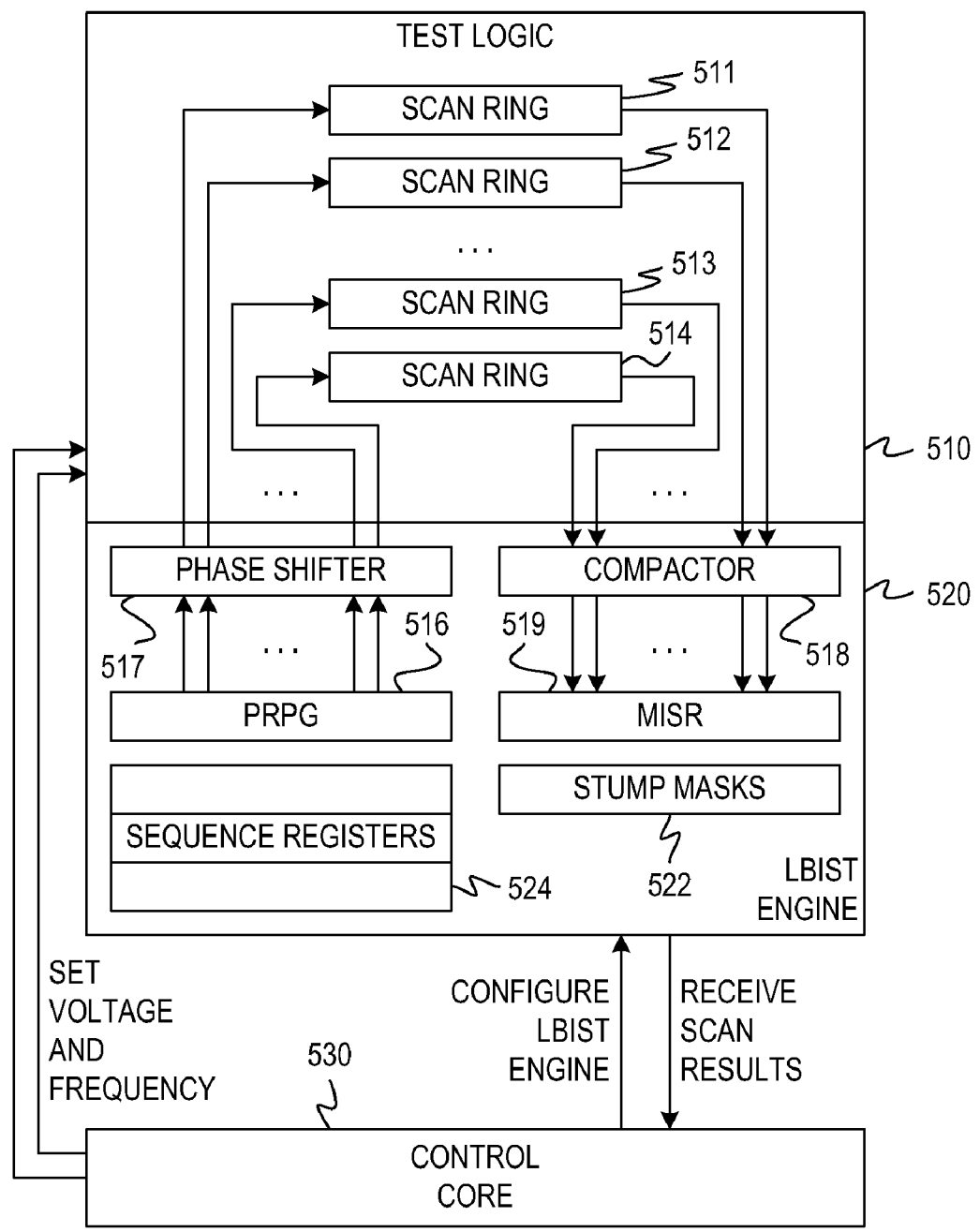
FIG. 5 is a block diagram of one example of a mechanism for internally controlling and enhancing logic built-in self test in a test core within a multiple core microprocessor in accordance with an illustrative embodiment.

FIG. 5 is a block diagram of one example of a mechanism for internally controlling and enhancing logic built-in self test in a test core within a multiple core microprocessor in accordance with an illustrative embodiment. Control core 530 sets voltage and frequency for test logic 510. Control core 530 configures LBIST engine 520 by setting stump masks 522 and sequence registers 524. LBIST engine 520 performs scans on test logic 510.

As depicted in FIG. 5, the LBIST engine comprises a pseudo-random pattern generator (PRPG) 516, a phase shifter 517, a compacter 518, and a multiple input signature register (MISR) 519. These LBIST components are integrated with test logic 510, which the LBIST engine 520 is designed to test. One of the functions of LBIST engine 520 is to provide a seed value to PRPG 516. Based upon this seed value, PRPG 516 generates a pseudo-random sequence of bits that are processed by phase shifter 517 and loaded into scan rings 511-514. LBIST engine 520 controls the manner by which this pseudo-random sequence of bits is loaded into the scan rings 511-514 by way of a sequence of cycle states determined based on the configuration provided as an input to the LBIST engine 520.

The purpose of the pseudo-random sequence of bits generated by PRPG 516 is to provide a set of input bits to be propagated through the functional logic components of test logic 510. The pseudo-random sequence is therefore provided to each of the scan rings 511-514. It should be noted, however, that the pseudo-random bit sequence is loaded into scan chains 511-514 only after being processed by phase shifter 517.

It should be noted that, while only four scan chains 511-514 are depicted in FIG. 5, there may be many scan chains in the test logic 510. If more scan rings are included in the design, more fine-grained testing of the logic circuit may be performed. In other words, if there are more scan rings in the design, fewer of the components of the logic circuit are positioned between successive scan rings.

Phase shifter 517 makes the character of the bit sequence loaded into the scan rings 511-514 more random. That is, phase shifter 517 shifts the phase of the pseudo-random sequence of bits so that an identifiable pattern within succeeding bit sequences of different scan chains is not present. Essentially, phase shifter 517 operates by shifting the phase of each succeeding column with respect to the preceding column. In other words, rather than being offset by a single bit in each succeeding column, the bit patterns in succeeding columns are shifted by different amounts. This randomization of the pseudo-random bit sequence that is loaded into scan rings 511-514 improves fault coverage and effectiveness of the LBIST testing. While not essential to the test architecture, phase shifter 517 therefore improves the operation of LBIST engine 520.

The pseudo-random bit patterns that are generated by PRPG 516 and phase shifter 517 are loaded into scan rings 511-514. Each of scan rings 511-514 comprises a series of scan latches that are configured to alternately shift data (the pseudo-random bit patterns or functional logic output) through the scan rings or to hold data that has been propagated through the functional logic.

As indicated above, a separate sequence is loaded into each of scan rings 511-514. Each of scan rings 511-514 is positioned before or after (interposed with) respective portions of test logic 510. Thus, for each portion of test logic 510, there is a scan ring that precedes this portion and provides inputs to the corresponding logic, as well as a scan ring that follows this portion and receives the output of the corresponding logic. The scan rings thereby define "levels" of the test logic (portions of the test logic between successive scan rings). For example, one level of test logic 510 may receive input bits from scan ring 511 and provide output bits to scan ring 512. Similarly, another level of test logic 510 may receive input bits from scan ring 513 and provide output bits to scan ring 514. It should be noted that some of scan rings 511-514 may serve both to provide input bits to a succeeding level of test logic 510 and to receive output bits from a preceding level of test logic 510.

After the pseudo-random bit patterns have been allowed to propagate through the functional components of test logic 510 and the results have been captured in scan rings 511-514, the contents of scan rings 511-514 are scanned out of the scan rings (i.e., they are unloaded from the scan rings) to compactor 518 and MISR 519. The purpose of compactor 518 is simply to reduce the number of bits that have to be handled by MISR 519. Compactor 518 may be implemented in a number of ways. Typically, the compactor 518 employs a series of XOR gates, where the output of each XOR gate is based upon inputs received from a pair of scan rings. The number of bits that are then passed to MISR 519 can therefore be reduced by a factor of 2, for instance. In alternative environments, more complex circuitry may allow the number of bits to be reduced by an even greater factor.

Control core 530 sets stump masks 522 to isolate a failure to a particular latch scan ring, and then to a position within the scan ring. By masking known bad stumps and locations within stumps, control core 530 may have sophisticated software written to find several top failing paths for future root cause and characterization analysis.

Figure 6:
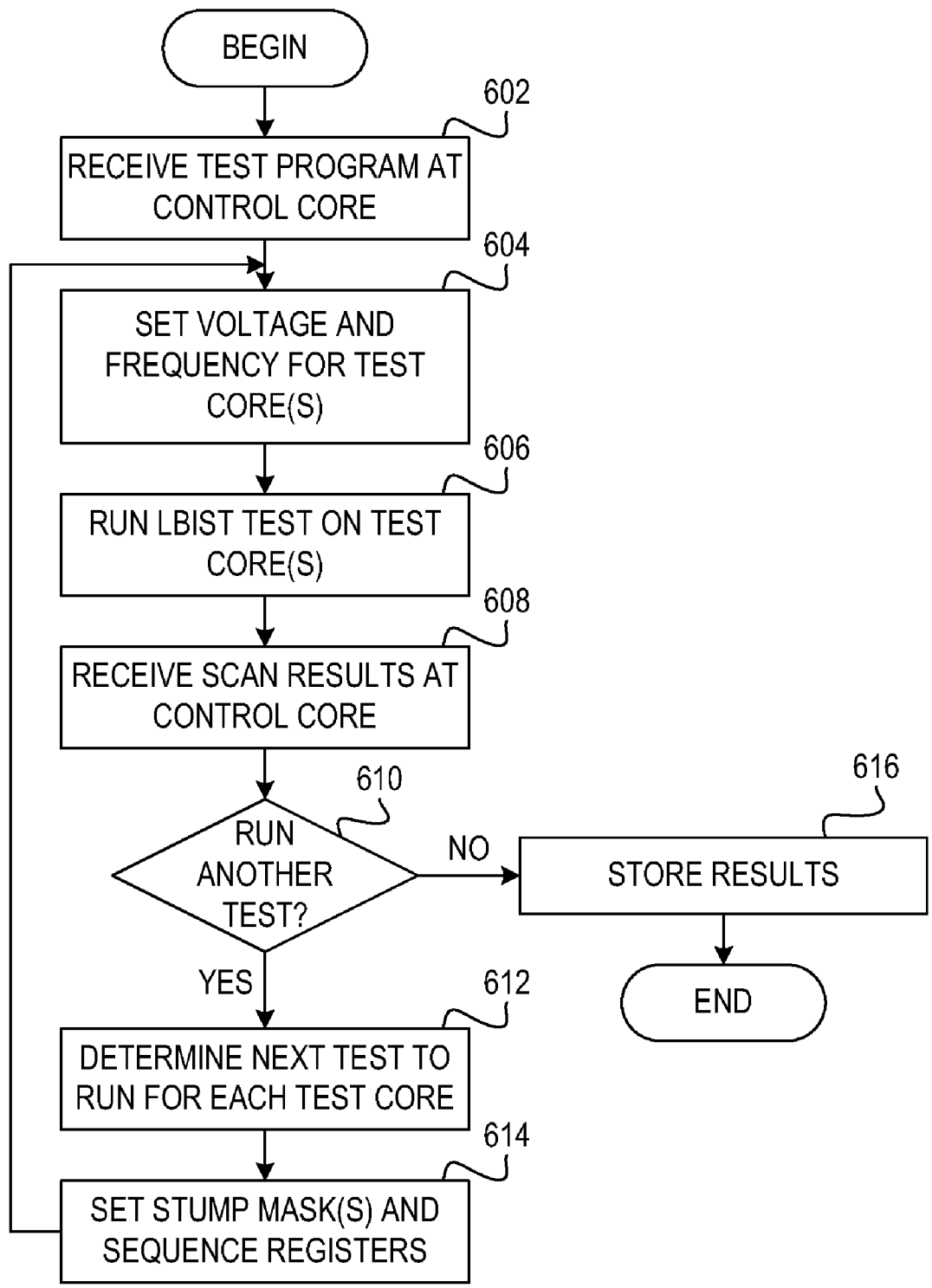
FIG. 6 is a flowchart illustrating operation of a mechanism for internally controlling and enhancing logic built-in self test in a multiple core microprocessor in accordance with an illustrative embodiment.

FIG. 6 is a flowchart illustrating operation of a mechanism for internally controlling and enhancing logic built-in self test in a multiple core microprocessor in accordance with an illustrative embodiment. Operation begins, and the control core receives a test program (block 602). The control core sets voltage and frequency for one or more test cores (block 604). The control core then runs logic built-in self test (LBIST) on one or more test cores (block 606) and receives scan results (block 608).

Then, the control core determines whether to run another test all or a subset of the one or more test cores (block 610). If the control core determines not to run another test, the control core stores results (block 616), and operation ends. The control core may store results in the control core's dedicated memory, such as control core memory 212 in FIG. 2C or L2 cache 114 or LS 163-170 in FIG. 1. Alternatively, the control core may scan results into the scan rings of the cores under test where they can be retrieved later for evaluation.

If the control core determines to run another test in block 610, the control core determines a next test to run for each test core (block 612). The control core sets one or more stump masks and sequence registers (block 614). Thereafter, operation returns to block 604 to set voltage and frequency for one or more test cores and run LBIST tests.

Figure 7:
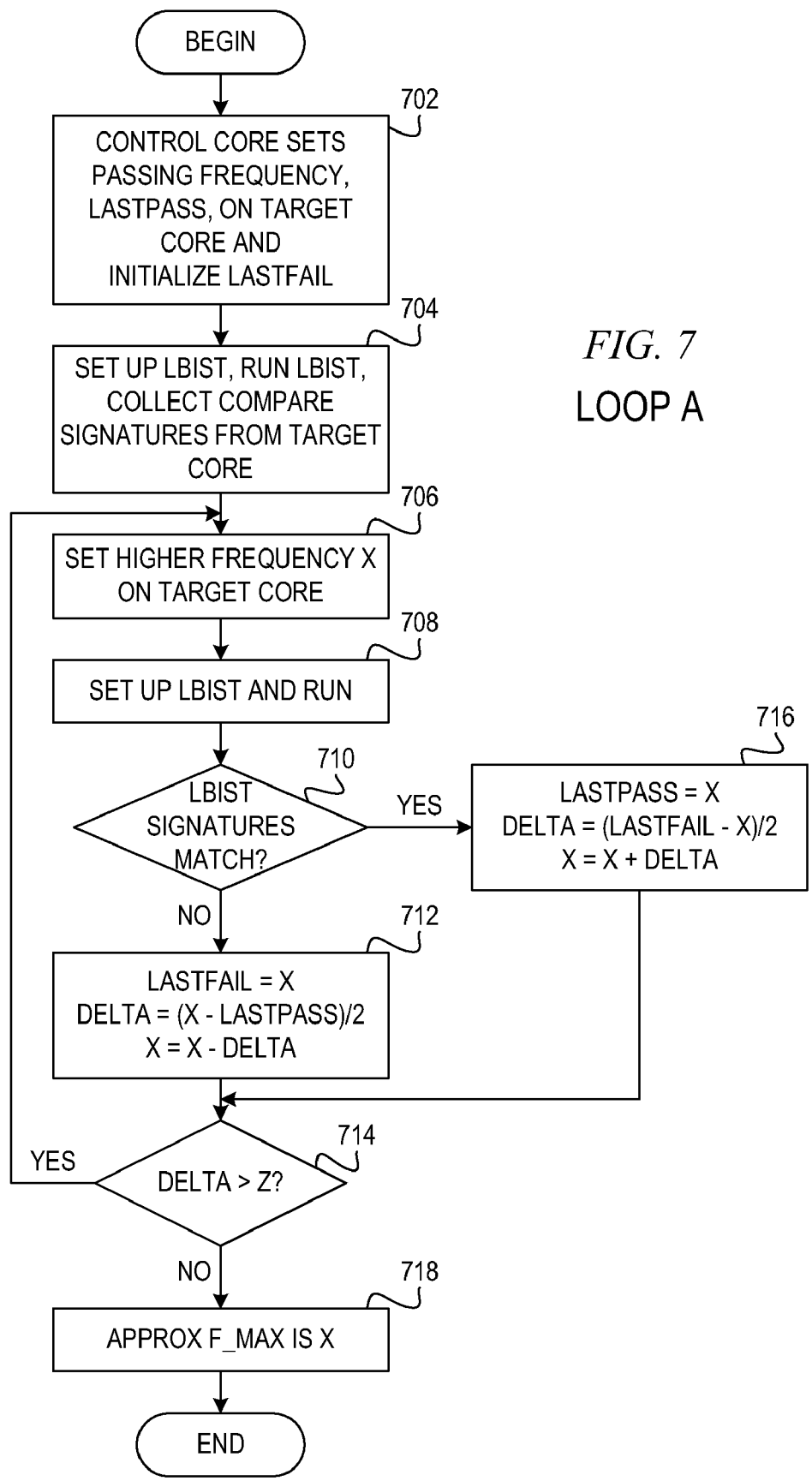
FIG. 7 is a flowchart illustrating on-chip operation of a control core for determining a maximum logic built-in self test frequency in accordance with an illustrative embodiment.

FIG. 7 is a flowchart illustrating on-chip operation of a control core for determining a maximum logic built-in self test frequency in accordance with an illustrative embodiment. This operation is referred to hereinafter as "loop A." Operation begins, and the control core sets a passing frequency, LASTPASS, on a target core and initializes LASTFAIL (block 702). LASTPASS is initially set to a known passing frequency, and LASTFAIL is initialized to some predetermined maximum frequency. The control core sets up the logic built-in self test (LBIST) engine, runs the LBIST, and collects compare signatures from the target core (block 704).

Next, the control core sets a higher frequency, a predetermined value X, on the target core (block 706) and sets up the LBIST engine and runs the LBIST (block 708). The control core determines whether the resulting LBIST signature matches the compare signature (block 710). If the LBIST signatures do not match, the control core sets LASTFAIL, which represents the last frequency that resulted in a failed LBIST to X, sets DELTA to (X−LASTPASS)/2 and sets X to be X−DELTA (block 712). Then, the control core determines whether DELTA is greater than a predetermined value Z (block 714). If the LBIST signatures match in block 710, the control core sets LASTPASS equal to X, sets DELTA equal to (LASTFAIL−X)/2, and sets X equal to X+DELTA (block 716). Then, operation proceeds to block 714 to determine whether DELTA is greater than Z.

If DELTA is greater than Z, then operation returns to block 706 to set the frequency, X, on the target core and run the LBIST again. If, however, DELTA is not greater than Z in block 714, then the control core approximates F_MAX to be X (block 718), and operation ends.

Figure 8:
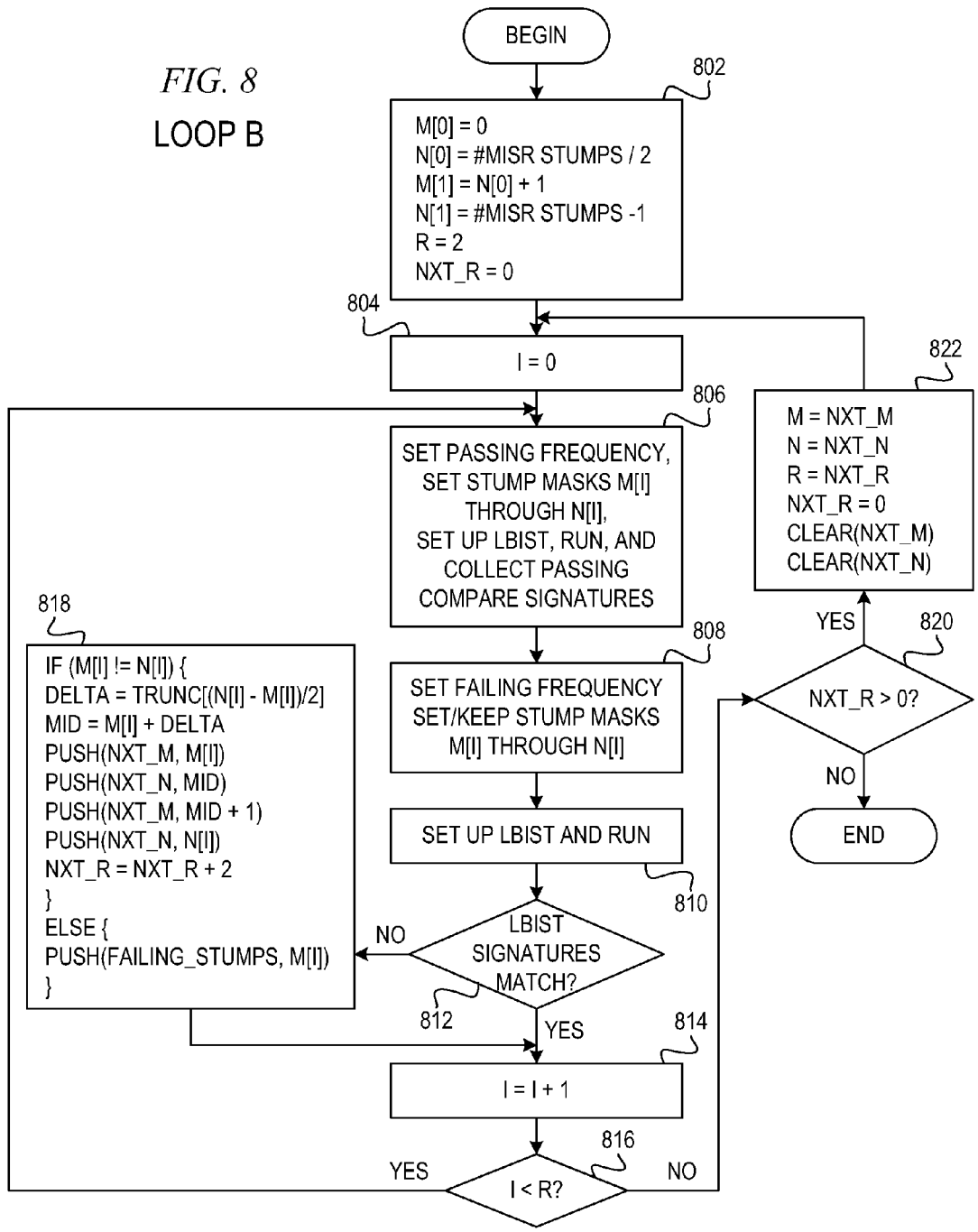
FIG. 8 is a flowchart illustrating on-chip operation of a control core to isolate failing stumps in accordance with an illustrative embodiment.

FIG. 8 is a flowchart illustrating on-chip operation of a control core to isolate failing stumps in accordance with an illustrative embodiment. This operation is referred to hereinafter as "loop B." Operation begins, and the control core sets M[0] equal to zero, N[0] equal to the number of multiple input shift register (MISR) stumps divided by two, sets M[1] equal to N[0]+1, N[1] equal to the number of MISR stumps minus one, R equal to two, and NXT_R equal to zero (block 802). The control core then sets an index, I, to zero (block 804).

Thereafter, the control core sets a passing frequency, sets stump masks M[I] through N[I], sets up the LIBST engine, runs the LBIST, and collects passing compare signatures (block 806). The control core sets a failing frequency and sets or keeps stump masks M[I] through N[I] (block 808). Then, the control core sets up the LIBST engine and runs the LBIST (block 810).

The control core then determines whether the resulting LBIST signatures match the passing compare signatures (block 812). If the LBIST signatures match, the control core sets I=I+1 (block 814) and determines whether I is less than a predetermined value, R (block 816). If the LBIST signatures do not match in block 812, then in block 818 the control core performs the following:

```
IF (M[I] != N[I]) {
    DELTA = TRUNC[(N[I] − M[I])/2]
    MID = M[I] + DELTA
    PUSH(NXT_M, M[I])
    PUSH(NXT_N, MID)
    PUSH(NXT_M, MID + 1)
    PUSH(NXT_N, N[I])
    NXT_R = NXT_R + 2
}
ELSE {
    PUSH(FAILING_STUMPS, M[I])
}
```

This results in the failing stumps, when located, being pushed into the FAILING_STUMPS data structure. The TRUNC function truncates a number to an integer. For example, TRUNC[2.5] would be 2. The PUSH function adds an element to the end of an array. If the current stump is a failing stump, then it is added to the FAILING_STUMPS data structure. If the current stump is not a failing stump, then the operations in block 818 add next M and N to the NXT_M and NXT_N data structures, respectively, for the stump masks for the next iteration. Thereafter, operation proceeds to block 814 to determine increment I, and the control core determines whether I is less than a predetermined value, R (block 816)

If I is less than R, then operation returns to block 806 to repeat the LBIST for the next set of stump masks M[I] through N[I]. If I is not less than R in block 816, then the control core determines whether NXT_R is greater than zero (block 820). If NXT_R is greater than zero, then the control core sets M=NXT_M, sets N=NXT_N, sets R=NXT_R, sets NXT_R=0, clears NXT_M, and clears NXT_N (block 822). Then, operation returns to block 804 to set I=0 and repeat the LBIST to locate failing stumps. However, if NXT_R is not greater than zero in block 820, then operation ends.

Figure 9:
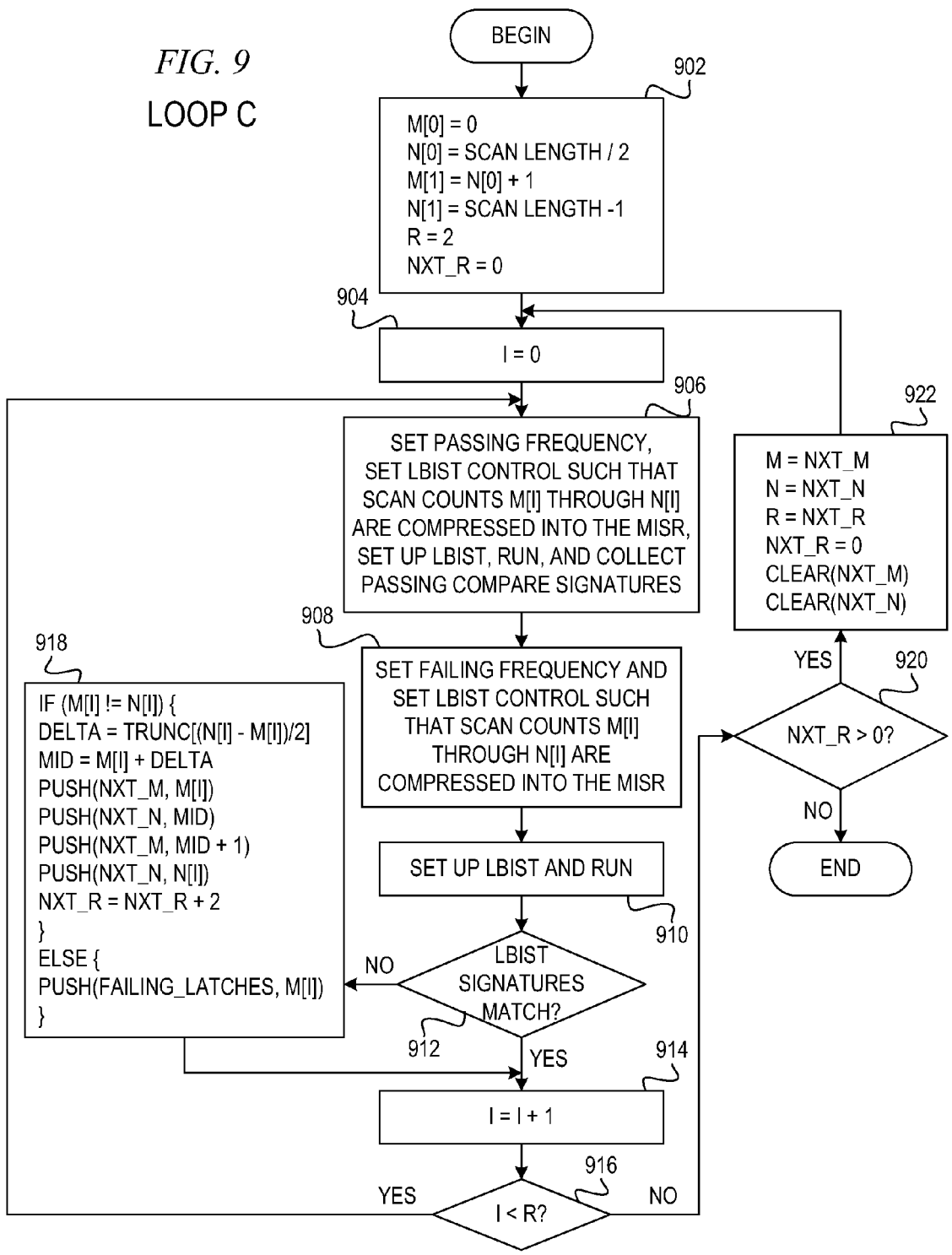
FIG. 9 is a flowchart illustrating on-chip operation of a control core to isolate failing latches within stumps in accordance with an illustrative embodiment.

FIG. 9 is a flowchart illustrating on-chip operation of a control core to isolate failing latches within stumps in accordance with an illustrative embodiment. This operation is referred to hereinafter as "loop C." Operation begins, and the control core sets M[0] equal to zero, N[0] equal to the scan length divided by two, sets M[1] equal to N[0]+1, N[1] equal to the scan length minus one, R equal to two, and NXT_R equal to zero (block 902). The control core then sets an index, I, to zero (block 904).

Thereafter, the control core sets a passing frequency, sets the LBIST control such that scan counts M[I] through N[I] are compressed into the MISR, sets up the LIBST engine, runs the LBIST, and collects passing compare signatures (block 906). The control core sets a failing frequency and sets the LIBST control such that scan counts M[I] through N[I] are compressed into the MISR (block 908). Then, the control core sets up the LIBST engine and runs the LBIST (block 910).

The control core then determines whether the resulting LBIST signatures match the passing compare signatures (block 912). If the LBIST signatures match, the control core sets I=I+1 (block 914) and determines whether I is less than a predetermined value, R (block 916). If the LBIST signatures do not match in block 912, then in block 918 the control core performs the following:

```
IF (M[I] != N[I]) {
    DELTA = TRUNC[(N[I] − M[I])/2]
    MID = M[I] + DELTA
    PUSH(NXT_M, M[I])
    PUSH(NXT_N, MID)
    PUSH(NXT_M, MID + 1)
    PUSH(NXT_N, N[I])
    NXT_R = NXT_R + 2
}
ELSE {
    PUSH(FAILING_LATCHES, M[I])
}
```

This results in the failing latches, when located, being pushed into the FAILING_LATCHES data structure. If the current latch is a failing latch, then it is added to the FAILING_LATCHES data structure. If the current latch is not a failing latch, then the operations in block 918 add next M and N to the NXT_M and NXT_N data structures, respectively, for the next iteration. Thereafter, operation proceeds to block 914 to increment I, and the control core determines whether I is less than R (block 916).

If I is less than R, then operation returns to block 906 to repeat the LBIST for the next set of scan counts M[I] through N[I]. If I is not less than R in block 916, then the control core determines whether NXT_R is greater than zero (block 920). If NXT_R is greater than zero, then the control core sets M=NXT_M, sets N=NXT_N, sets R=NXT_R, sets NXT_R=0, clears NXT_M, and clears NXT_N (block 922). Then, operation returns to block 904 to set I=0 and repeat the LBIST to locate failing latches. However, if NXT_R is not greater than zero in block 920, then operation ends.

Figure 10:
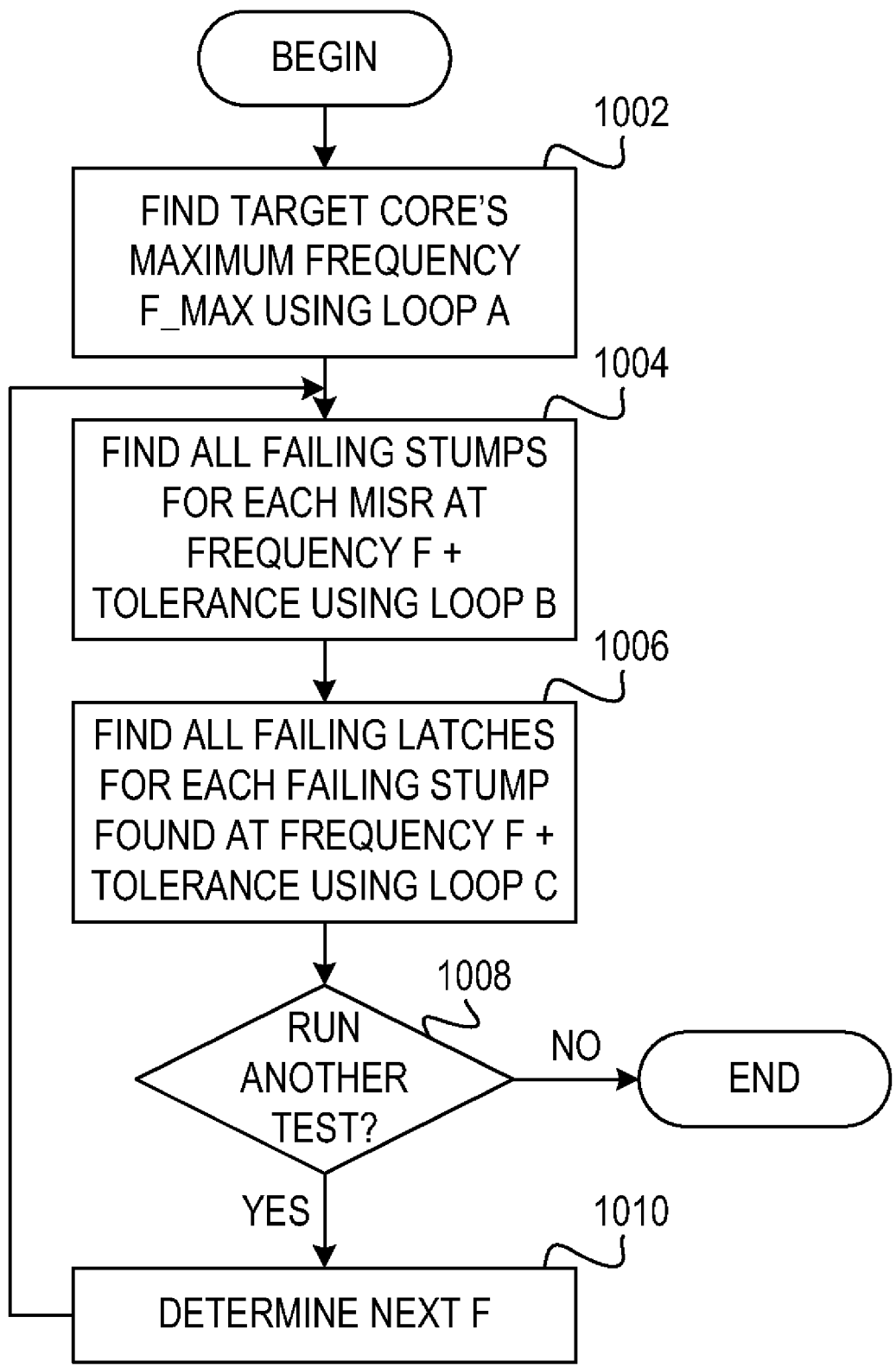
FIG. 10 is a flowchart illustrating on-chip operation of a control core to locate failing stumps and latches within stumps on a target core in accordance with an illustrative embodiment.

FIG. 10 is a flowchart illustrating on-chip operation of a control core to locate failing stumps and latches within stumps on a target core in accordance with an illustrative embodiment. Operation begins and the control core finds the target core's maximum frequency, F_MAX, using loop A (block 1002). The control core then finds all failing stumps for each MISR at a frequency, F, plus tolerance using loop B (block 1004). Then, the control core finds all failing latches for each failing stump found at frequency F plus tolerance using loop C (block 1006). The control core determines whether to run another test (block 1008). The control core may perform this determination by determining whether a specific frequency is achieved or a predetermined number of failing latches have been found.

If the control core determines to run another test, then the control core determines a next F (block 1010), and operation returns to block 1004 to find failing stumps at that frequency. If the control core determines not to run another test in block 1008, then all latches of interest are found, and operation ends.

Thus, the illustrative embodiments provide mechanisms for internally controlling and enhancing advanced test and characterization in a multiple core microprocessor. To decrease the time needed to test a multiple core chip, the mechanism uses micro-architectural support that allows one core, a control core, to run a functional program to test the other cores. Test time is reduced by eliminating the need to communicate with an external testing device during the test sequence, which is relatively inefficient compared to internal chip communications. Because the speed at which the program runs at-speed on one of the processor cores, many new test opportunities exist that in the past have been prohibitive due to test time and tester memory limitations.

In one illustrative embodiment, the control core may use architectural support for scan and external scan communication (XSCOM) to independently test the other cores while adjusting their frequency and/or voltage. A program loaded onto the control core may adjust the frequency and configure the LBIST to run on each of the cores under test. Once LBIST has completed on a core under test, the control core's program may evaluate the results and decide a next test to run for that core. For isolating failing latch positions, the control core may iteratively configure the LBIST mask and sequence registers on the core under test to determine the location of the failing latch. The control core may control the LBIST stump masks to isolate the failure to a particular latch scan ring and then position within that ring.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for internally controlling logic built-in self test in a multiple core microprocessor, the method comprising:
   receiving a test program at a control core within the multiple core microprocessor, wherein the multiple core microprocessor comprises a plurality of processing cores including the control core;
   setting, by the control core under control of the test program, voltage and frequency for a test core within the plurality of processing cores;
   configuring, by the control core under control of the test program, a logic built-in self test engine of the test core;
   running, by the logic built-in self test engine, a logic built-in self test on test logic within the test core;
   receiving, by the control core under control of the test program, logic built-in self test results from the test core; and
   storing, by the control core under control of the test program, the logic built-in self test results.

2. The method of claim 1, wherein configuring the logic built-in self test engine comprises:
   setting sequence registers and stump masks in the logic built-in self test engine.

3. The method of claim 1, further comprising:
   determining a next logic built-in self test on the test core.

4. The method of claim 3, wherein determining a next logic built-in self test on the test core comprises:
   comparing the logic built-in self test results to results from a low frequency and high voltage logic built-in self test run.

5. The method of claim 3, wherein determining a next logic built-in self test on the test core comprises:
   comparing the logic built-in self test results to results from a known good core or results from a simulation environment.

6. The method of claim 3, further comprising:
   responsive to the logic built-in self test results indicating a failure, setting, by the control core, the stump masks to isolate the failure to a particular scan ring in the test logic within the test core.

7. The method of claim 1, wherein storing the logic built-in self test results comprises storing the logic built-in self test results in a dedicated memory of the control core.

8. The method of claim 1, wherein storing the logic built-in self test results comprises scanning the logic built-in self test results into scan rings within the test logic within the test core.

9. The method of claim 1, further comprising:
   setting, by the control core, a flag indicating that the test is complete.

10. A computer program product comprising a computer recordable medium having a computer readable program recorded thereon, wherein the computer readable program, when executed on a control core within a multiple core microprocessor having a plurality of processing cores including the control core, causes the control core to:
    receive a test program;
    set, under control of the test program, voltage and frequency for a test core within the plurality of processing cores;
    configure, under control of the test program, a logic built-in self test engine of the test core;
    run a logic built-in self test on test logic within the test core;
    receive, under control of the test program, logic built-in self test results from the test core; and
    store, under control of the test program, the logic built-in self test results.

11. The computer program product of claim 10, wherein configuring the logic built-in self test engine comprises:
    setting sequence registers and stump masks in the logic built-in self test engine.

12. The computer program product of claim 10, further comprising:
    determining a next logic built-in self test on the test core.

13. The computer program product of claim 12, wherein determining a next logic built-in self test on the test core comprises:
    comparing the logic built-in self test results to results from a low frequency and high voltage logic built-in self test run.

14. The computer program product of claim 12, wherein determining a next logic built-in self test on the test core comprises:
    comparing the logic built-in self test results to results from a known good core or results from a simulation environment.

15. The computer program product of claim 12, further comprising:
    responsive to the logic built-in self test results indicating a failure, setting, by the control core, the stump masks to isolate the failure to a particular scan ring in the test logic within the test core.

16. A multiple core microprocessor, comprising:
    a plurality of processing cores including a control core and a plurality of test cores;
    a logic built-in self test engine associated with each of the plurality of test cores; and
    a memory coupled to the control core, wherein the memory comprises instructions which, when executed by the control core, cause the control core to:
    receive a test program;
    set, under control of the test program, voltage and frequency for a given test core within the plurality of test cores;
    configure, under control of the test program, a given logic built-in self test engine of the given test core;
    run, by the given logic built-in self test engine, a logic built-in self test on test logic within the given test core;
    receive, under control of the test program, logic built-in self test results from the test core; and
    store, under control of the test program, the logic built-in self test results.

17. The multiple core microprocessor of claim 16, wherein configuring the given logic built-in self test engine comprises:
    setting sequence registers and stump masks in the given logic built-in self test engine.

18. The multiple core microprocessor of claim 16, wherein storing the logic built-in self test results comprises storing the logic built-in self test results in a dedicated memory of the control core.

19. The multiple core microprocessor of claim 16, wherein storing the logic built-in self test results comprises scanning the logic built-in self test results into scan rings within the test logic within the given test core.

20. The multiple core microprocessor of claim 16, wherein the instructions further cause the control core to:
    set a flag indicating that the test is complete.

* * * * *